Nov. 15, 1960 C. F. HALL 2,960,633

ELECTRONIC CHASSIS CONSTRUCTION

Filed Feb. 7, 1957 2 Sheets-Sheet 1

INVENTOR
CLIFFORD F. HALL
BY
Spencer E. Olson
ATTORNEY

ELECTRONIC CHASSIS CONSTRUCTION

Filed Feb. 7, 1957 2 Sheets-Sheet 2

INVENTOR
CLIFFORD F. HALL
BY
Spencer E. Olson
ATTORNEY

United States Patent Office 2,960,633

Patented Nov. 15, 1960

2,960,633

ELECTRONIC CHASSIS CONSTRUCTION

Clifford F. Hall, Buffalo, N.Y., assignor, by mesne assignments, to Sylvania Electric Products Inc., Wilmington, Del., a corporation of Delaware Filed Feb. 7, 1957, Ser. No. 638,765

4 Claims. (Cl. 317—101)

This invention relates to the packaging of electronic equipment, and is more particularly concerned with the construction and arrangement of an electronic chassis. More specifically, the invention is directed toward a chassis construction which affords the efficient utilization of cooling air in maintaining the components thereof at a temperature to insure reliable operation of the components, and is particularly useful as a sub-assembly of the electronic packaging and cooling system described and claimed in application Serial No. 637,476, filed January 31, 1957, by A. A. Gradisar, A. S. Gutman, and J. A. Meyer, and assigned to the same assignee as the present application.

Most of the electric power used to operate present-day electronic equipment is converted into unwanted heat; only a small part of the power is converted into useful energy. This results in an undesirable temperature rise in the equipment, the magnitude of which depends upon the amount of heat dissipated by the equipment to its environment. In ordinary electronic equipment, such as in a television receiver, little special design effort is necessary to provide the requisite transfer of heat, since there is normally sufficient space around the tubes and other components of the chassis that adequate cooling is provided by natural convection of air over the assembly. In certain specialized electronic equipment, however, where space and weight are of prime importance, miniaturization is employed, resulting in much greater heat density and the attendant requirement of transferring the heat from the chassis. A good example is in the case of airborne electronic equipment where obviously economy of space and weight is very important. Electronic equipment for installation in subsonic aircraft has been designed with little emphasis on cooling, the equipment simply rejecting its heat to the surrounding air, depending on free convection, or in some cases, the cooling air being circulated at low velocities by small blowers. In most applications, this method of cooling was satisfactory since the ambient air temperature was low relative to the operating temperatures of the equipment, or a source of cool air could be made available through utilization of the blower. With the advent of supersonic aircraft, however, new problems are presented since under critical conditions, the resultant ram air temperatures exceed the allowable operating temperatures of some electronic components so that the use of ram air for cooling becomes impossible unless its temperature is lowered. Therefore some other heat sink must be used and if air is to be utilized as the cooling medium, a refrigeration system is required. This results in a performance penalty to the aircraft by reason of the weight of the refrigeration system, and because power is required to operate the refrigeration system, which increases the fuel consumption. Consequently, it is desirable to provide electronic equipment cooling with the minimum flow of cooling air in order to minimize the resultant range penalty.

If the electronic equipment heat load in the cabin of the aircraft is simply rejected to the surrounding cabin air, as was the practice in the past, the cooling load on the cabin conditioning system will be increased by exactly that amount. However, if the equipment is thermally insulated from the cabin and is designed to be cooled by exhaust cabin air, just before the air is to be dumped overboard, no extra load is imposed on the air conditioning system, provided the air temperature required for cooling equipment is equal to or less than that required to cool the cabin. Such of the electronic equipment as is not located in the cabin must be cooled directly with air supplied by the airplane conditioning system, and accordingly places a definite load on the conditioning system. Thus, the cooling of the electronic equipment carried by high speed aircraft imposes a range penalty under all flight conditions, thereby increasing the importance of keeping the required cooling air flow to an absolute minimum.

From the simple heat balance equation of a piece of electronic equipment which has a fixed heat rejection, it is obvious that the cooling air flow required can be minimized by either decreasing the cooling air temperature at the inlet to the equipment or increasing the exit air temperature. The inlet air temperature is a function of the characteristics and design of the aircraft refrigeration system and supplies air at a temperature as low as is compatible with other airplane considerations. If the exit temperature can be increased while holding the inlet temperature constant, a smaller volume of air is required to remove the fixed heat load, and if this increase in temperature can be obtained without an attendant increase in the component surface temperatures, that is, if the components can be maintained at a temperature at which they are reliable in operation, improved cooling efficiency will have been achieved.

The major part of the heat dissipation from electronic equipment is generated by the vacuum tubes, and efficient cooling of any electronic package requires that they be efficiently cooled. Also, since vacuum tubes normally have higher allowable surface temperatures than the rest of the components, efficient cooling of tubes will permit a higher exit air temperature from the package, thus accomplishing the objectives mentioned above. One approach which has been employed to improve cooling efficiency is the so-called cold-plate technique, which utilized a double-walled metallic container for the electronic package, with the cooling air directed through the double wall. The tubes are enclosed in tightly fitting shields, which, in turn, are clamped to the colder wall of the container. Heat is transferred from the tubes to the shields and thence to the cold plate by conduction, and from the cold wall to the cooling air by convection. With careful design, the cold wall package does not appreciably add to the weight of the equipment, but the system has certain inherent inefficiencies. It is generally agreed that for reliable operation of most sub-miniature electron tubes, the average temperature of the envelope must be kept below 280° F. It has been found that to accomplish this, the shield enclosing the tube must be kept to about 270° F., and the cold plate kept to about 220° F., with the consequence that the maximum temperature at which the cooling air can be discharged is about 180° F. This increase in exit temperature results in some improvement in the efficiency of utilization of available coolant but the spread of 100 degrees between the exit temperature and the temperature to which the tube must be maintained indicates that further improvement is possible. That is, if the exit temperature could be made more nearly equal to tube temperatures at which reliability considerations are satisfied, then a lower volume of cooling fluid would be required.

Another aspect of the problem is the conflict between electronic design requirements and the cooling requirements of the package. In general, the electronic designer prefers to arrange components in a functional manner and, of course, it is often necessary to give special attention to the length and placement of leads to prevent pick-up or interference. It will be apparent that a location of components to satisfy electronic requirements may be inconsistent with a location where the heat generating components can be efficiently cooled by the cold plate or other cooling arrangement. In general, the electronic designer is not permitted significant latitude in the arrangement of parts, and, accordingly, it is desirable that a cooling system be provided which will allow independent cooling of the hot components without sacrificing efficiency in the utilization of the cooling medium. Moreover, the system must be practical, and not materially increase the weight or volume of the electronic package.

A primary object of the present invention is to provide an improved construction for an electronic chassis.

Another object of the invention is to provide an electronic chassis assembly having the parts arranged so as to be efficiently and conveniently cooled.

Another object of the invention is to provide an electronic chassis wherein components of low heat density are separated from components of high heat density and arranged to allow the flow of cooling air thereover in a direction of ascending temperature.

In the system described in the above-reference application, improved cooling of electronic equipment is achieved by a combination of techniques including isolation of the hotter components from the lower temperature components both by distance and thermal insulation, insulation of the high heat density components, the low heat density components, or both, from the surrounding ambient, and passing the cooling air directly in contact with the hot components, the passages for air flow being designed to provide a sufficiently high heat transfer coefficient that the exit air temperature is not materially above that to which the hotter components must be cooled. In accordance with the present invention, the electronic chassis is assembled on a circuit board with low temperature heat generating components, such as resistors, mounted on one side of the board to separate them from non-dissipative components, such as condensers, which are mounted on the other side of the board. The electron tubes, which are usually of the sub-miniature type in equipment of the type here under discussion, are mounted on an edge of the circuit board and extend therefrom in the plane of the board. The tubes, in turn, are surrounded by conductive electrostatic shields provided with means for spacing the shields a predetermined distance from the tube envelope to provide an annular passage of controlled dimensions for the cooling air. The tubes and shields are surrounded by thermal insulation, such as light-weight foamed plastic, which insulates the tubes from the other components of the circuit and from the ambient. An air duct is formed in the foamed plastic for receiving the air after passing over the tubes and to discharge it into an external reservoir. Cooling air is drawn into the system and passes over the components in the direction of ascending temperature; that is, the inlet air first passes over the capacitors and resistors, which normally must be operated at relatively low temperatures to insure reliability, then over the exposed leads of the vacuum tubes, which have a lower permissible temperature than other parts of the tube, through the annular space between the tube and shield, and into the duct and exhausted. In this connection, it has been determined that certain areas of the tube may be operated at higher temperatures than other areas and that consequently it is unnecessary to keep the entire tube at the lowest permissible temperature in order to have reliable operation of the tube. For example, it has been found that at the hot spot on the surface of the tube, which is usually in the region of the anode, reliable operation is obtainable even if the temperature goes as high as 330° F., whereas a temperature of the order of 300° F. in the vicinity of the tube leads may cause tube failure. Consequently, the cooling air is directed to reach the tube leads first so as to cool them to the lower temperature necessary for reliability, the resulting increase in temperature of the air, however, not being so great that the hot spot cannot be cooled to a safe temperature. In a chassis which includes a plurality of tubes, as is usually the case, the air is introduced to the tubes in parallel, the volume of the air flowing over each of the tubes being adjusted, for any predetermined exhaust pressure, in accordance with the heat dissipation of the individual tubes, to provide an optimum compromise between the maintenance of all areas of the tube at a temperature where reliable operation results and an exit air temperature as high as possible. The distribution of cooling air is accomplished by metering orifices and contributes to the overall efficiency of the cooling system, inasmuch as only that coolant to maintain the tube at a reliable operating temperature is supplied to each tube, thereby reducing the overall expenditure of cooling air.

Other objects, features and advantages of the invention, and a better understanding of its construction and operation will be apparent from the following detailed description taken in connection with the accompanying drawings in which.

Figures 1, 2, 3:
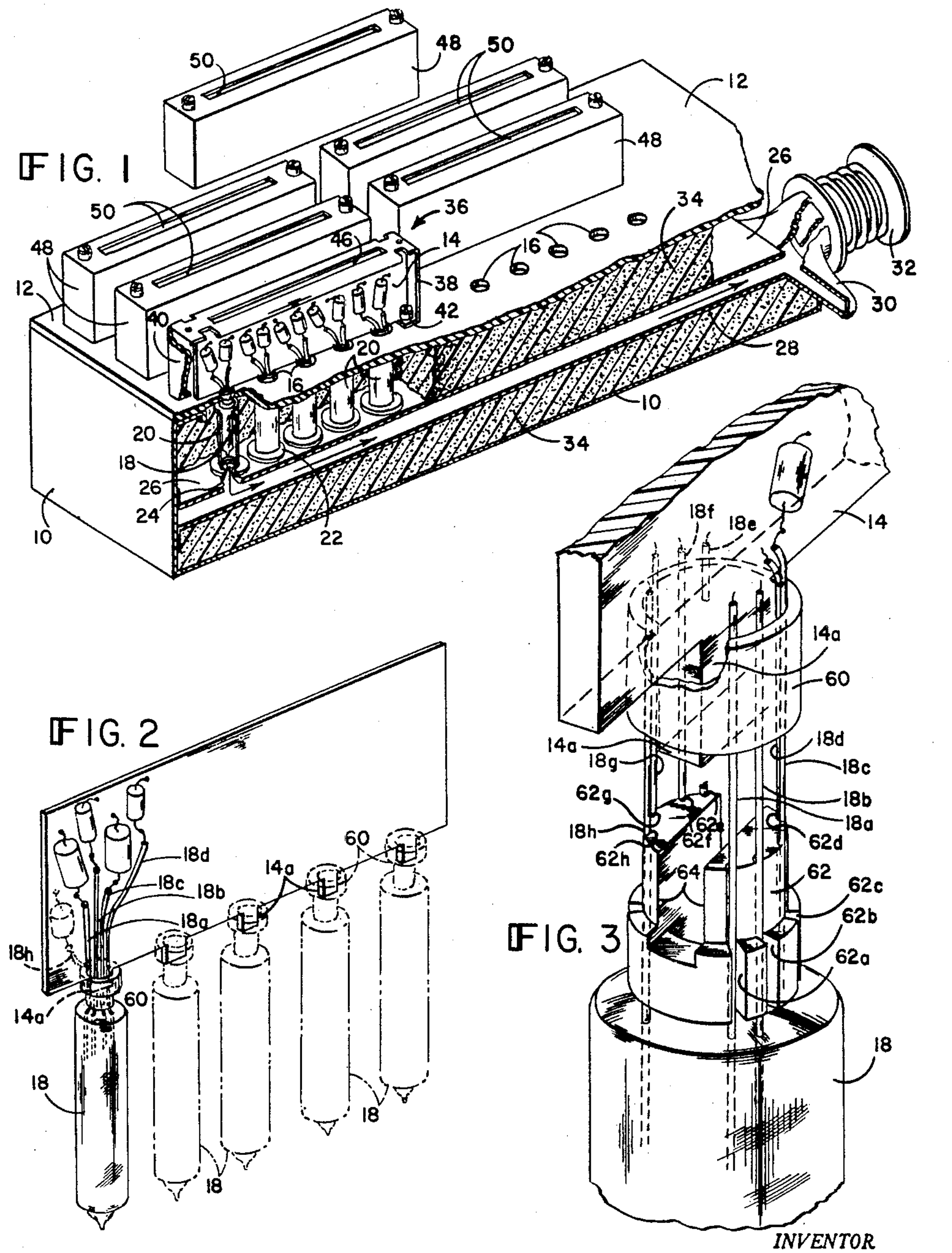
Fig. 1 is a perspective view, partially cut away, of an electronic chassis embodying the principles of the invention.
Fig. 2 is a schematic representation of a printed circuit board of the type employed in the chassis of Fig. 1.
Fig. 3 is a perspective view illustrating the mounting sub-miniature tubes on the edge of a circuit board of the type illustrated in Fig. 2.

Referring to the drawings, and more particularly to Fig. 1, the cooling techniques in accordance with this invention are particularly applicable to electronic equipment made up of a series of modules or sub-components, a type of construction currently used widely in the assembly of airborne electronic equipment. In the illustrated arrangement, the supporting structure for the chassis consists generally of a rectangular box 10 having a metallic outer shell preferably formed of light-weight material, such as aluminum, having a cover 12 formed of insulating material such as glass cloth laminated plastic. The chassis is made of a plurality of sub-components or modules, each mounted on a circuit board (to be described in more detail in connection with Figs. 2, 3 and 4), vertically positioned above the container 10. The lower edge of each of the terminal boards 14 rests on the cover 12 with the tubes 18 of the sub-chassis depending therefrom and passing through openings 16 in the cover 12. A tube shield 20 surrounds each of the tubes, to provide electrostatic shielding and to form an annular passage for cooling air around the tube. The lower end of each tube shield rests on an orifice plate 22 which has an opening 24 therein for controlling the volume of air passing over each tube. The orifice plates 22 are supported on plate 26, spaced from and parallel to cover 12, plate 26 with plate 28 forming an exhaust duct extending across the width of the box 10. At the right end of the duct, as viewed in Fig. 1, the duct narrows into a manifold 30, which, in turn, is connected to exhaust coupling 32. The spaces between cover 12 and plate 26, and between plate 28 and the bottom plate of container 10, are filled with a light-weight thermal insulation 34, such as a foamed plastic, which serves to thermally insulate the tubes to prevent the heat dissipated thereby from affecting the rest of the equipment.

Each of the circuit boards 14 is supported in a frame 36 preferably formed of thin, light-weight sheet metal with upstanding ends 38 and 40 which may be secured to cover plate 12 as by screws 42, and a top portion having a rectangular aperture 46 therein. An electrostatic shield 48, essentially a rectangular open-bottomed box, also formed of light-weight metal, is provided for each sub-chassis, fitting over the support 36. Each of the shields has a rectangular aperture 50 therein, located to be in register with the aperture 46 in the support 36 when the shield is in place, to permit the entrance of cooling air and distribution along both sides of the board 14.

From the description thus far, it will be seen that the tubes of the chassis are thermally insulated from the ambient in which the equipment is placed, and from each other, and from the other parts of the chassis which are normally operated at a lower temperature than the tubes. With the tubes thus insulated, it is obvious that there can be no cooling of them by natural convection, and accordingly, air must be passed over them to remove the heat which they dissipate. In the disclosed arrangement, ambient temperature air (if the equipment is located in a conditioned cabin), or air from an air conditioning system (if the equipment is located outside a conditioned cabin), is drawn through the aperture 50 of the electrostatic shield 48 and passes over both sides of the circuit board 14 to first cool the resistors and capacitors of the circuit which are assembled thereon. After passing the circuit board, with some increase in temperature, the air passes over the leads of the tubes 18, the leads being exposed on either side of the board 14, and enters the annular space between the tube envelope and the tube shield. It is generally recognized that the tube in the vicinity of the leads must be kept cooler than other parts of the tubes for reliable operation, since electrolysis in the glass is most likely to occur in this area at elevated temperatures. By cooling the tube leads and the base prior to the other parts of the tube these sensitive areas are kept the coolest. In passing over the tubes, the air temperature is further increased, there being a substantial gradient from the base to the top of the tube, the openings 24 in the orifice plates 22 being designed to provide a flow of air therethrough to provide a maximum exhaust temperature consistent with cooling of the tube to a temperature to insure the desired reliability. As an example, in a system embodying the invention, it is possible to exhaust the cooling air from the electronic package at a temperature of 250° F. While maintaining the temperature of the tube sufficiently low for reliability, say 330° F. at the hot spot of the tube. The heated air from all of the tubes of the chassis enters the duct formed by plates 26 and 28 and is exhausted through coupling 32 into a reservoir separate from the equipment, preferably overboard in the case of an aircraft. The exhaust equipment for removing the heated air from the package forms no part of the present invention, and consequently has not been illustrated, but in general, must possess the properties of providing a pressure differential between the inlet aperture 50 and the exhaust manifold 30 to draw cooling air through the system with sufficient velocity to provide a satisfactorily high heat transfer coefficient.

It will be noted that the tubes are cooled in parallel; that is, the supply of air entering openings 50 after passing circuit board 14 is presented to all of the tubes (in that module), the distribution of the air therethrough being determined by the sizes of the orifices associated with the several tubes. Thus, any tube can be mounted on the board in a position compatible with favorable electronic design, yet can be satisfactorily cooled by proper design of the orifice. Parallel flow also permits selection of orifice sizes to regulate the amount of air flowing over the tubes in accordance with their heat dissipation, so as to expend only that quantity of air necessary to maintain the tube at a safe temperature. With some tubes it may be possible to exhaust the air at a higher temperature than with others, or adequate cooling may be possible with less air flow, thus permitting considerable flexibility in the placement of parts while affording adequate cooling. While the system has been described as having only tubes extending from the circuit board and thermally insulated from the rest of the circuit, other dissipative components capable of operating at elevated temperatures, for example certain types of resistors and possibly transformers, may be similarly mounted and subjected to the preferential cooling afforded by the parallel flow system.

As was noted earlier, much of the heat dissipated by vacuum tubes is transferred by conduction by the metallic leads of the tube, and accordingly to remove the heat from the system, means must be provided efficiently to transfer this heat to the coolant. In accordance with this invention, tube sockets of the conventional type, which would prevent flow of air in direct contact with the tube leads, are eliminated, baseless tubes 18 instead being employed and mounted on an edge of the circuit board 14 as shown in detail in Figs. 2, 3 and 4. As best seen in Figs. 2 and 3, one edge of the circuit board 14 is provided with a series of projections or tabs **14*a* at the points where the tubes are to be located. The tube is joined to the tab 14*a* by a two-piece retainer, formed of insulating material such as "Teflon," consisting of a ring 60 and a serrated plug 62 having a diametral slot 64 formed therein for receiving the tab 14*a*. Since most electron tubes have eight leads, plug 62 is formed with eight longitudinal serrations or grooves 62*a*, 62*b*, 62*c*, etc., distributed over those portions of the periphery not occupied by the slot 64, preferably with four on each side of the slot. The grooves are of a size to receive the leads 18*a*, 18*b*, 18*c*, etc., of the tube 18 with sufficient clearance to permit assembly of ring 60 over the upper end of the plug and to allow a passage for air around each of the leads. During assembly, the leads of the tube are placed in the grooves of plug 62 as shown, the ring 60 placed over the plug to retain the leads in the grooves, this assembly then being affixed to the circuit board by inserting tab 14*a* into slot 64 with the tube leads distributed to opposite sides of the board. With the leads soldered to terminals or other circuit components on the board 14, a relatively rigid assembly results, the tab 14*a*** and the retainer serving to position the tube in the plane of the board. It will be seen that this construction exposes the leads of the tube whereby air flowing over the sides of the board may pass in direct contact with the leads as it flows toward the tube envelope.

Figures 4, 5:
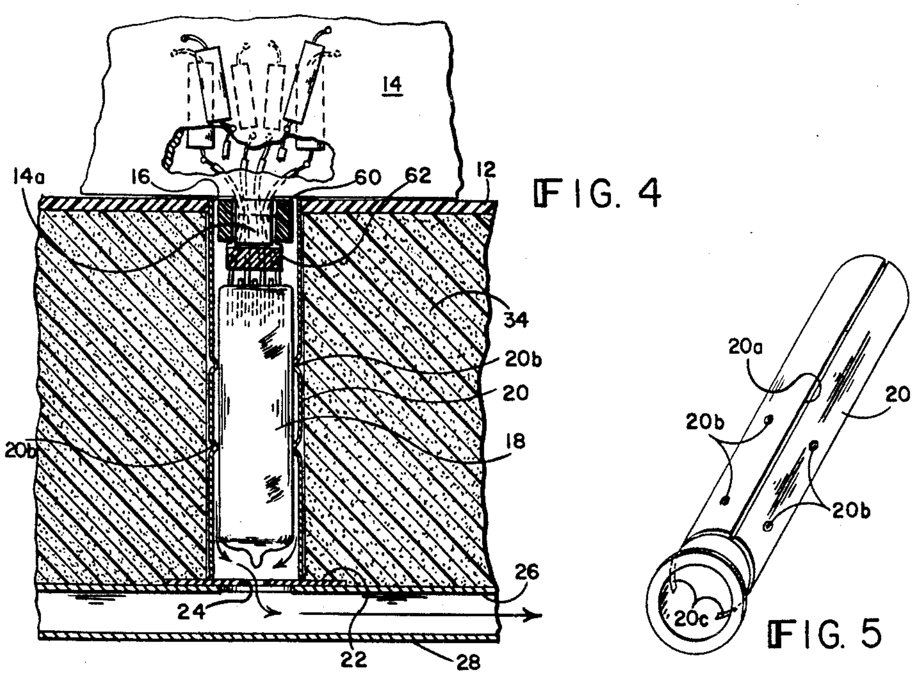
Fig. 4 is a fragmentary cross-sectional view of a portion of Fig. 1 illustrating the details of the tube mounting and and tube shield.
Fig. 5 is a perspective view of a tube shield for providing an annular air passage around the tubes of the assembly.

After flowing over and cooling the leads, the air is constrained to flow close to the tube envelope 18 by tube shield 20 which surrounds the tube and is embedded in the foamed plastic 34. In the fabrication of the package, the tube shields are positioned between plate 26 and the cover 12, in register with the openings 16 in the cover, and with the orifice plate 22 in place, the volume between the plates is filled with foamed plastic, such as polyisocyanate, a two-component foam-in-place plastic material, which is non-toxic, will withstand normal operation temperatures of 300° F. and will not support combustion. The foamed plastic is light in weight, having a density as low as 3 to 4 pounds per cubic foot, when sufficient air is introduced, yet forms a strong, rigid, self-supporting structure. Unlike conventional tube shields, the shield 20 is provided with a longitudinal slit **20*a* extending from the lower end over most of the length of the shield which terminates in a cut 20*c* extending around most of the periphery to shield 20, as shown in Fig. 5, to allow radial expansion of the shield. In addition, a plurality of dimples 20*b* are formed in the wall of the shield, for example, at two locations along the length thereof with three dimples equally spaced around the shield at the two locations. The purpose of the dimples is to maintain the dimension of the angular space between the tube and shield at a predetermined value. In a system constructed in accordance with the invention, it was found that a space between the tube and shield of .030" was necessary to maintain a satisfactory temperature gradient along the tube, but inasmuch as the manufacturing tolerance on the diameter of sub-miniature tubes is in excess of .030", it is impossible to maintain this spacing without the custom manufacture of a shield for each tube, a practice which obviously could not be tolerated where mass production is indicated. The provision of dimples 20***b*, which extend radially inward from the wall of the shield by .030", and together with the spring action afforded by slot 20*a* and cut 20*c*, insures that the tube envelope is always spaced .030" from the shield in spite of variations in the diameter of the tube. Apart from the heat transfer requirements, the shield also serves rigidly to position the tube to minimize any strain which might be placed on the connections of the tube leads to the circuit board 14 by shock or vibration.

At the base of each shield is a thin plate 22 having a sharp-edge metering orifice 24 therein to proportion the amount of air for each tube in accordance with its power dissipation. From the system standpoint, the orifice diameters of the several tubes are so designed, that for any predetermined exhaust pressure, each tube receives the proper amount of cooling air to maintain the tubes at a temperature which will insure reliable operation. To review, the cooling air, after passing over the circuit board 14, flows over the tube leads, through the passages of controlled area between the tubes and their respective shields, through the metering orifices, and then into the exhaust chamber or duct formed by plates 26 and 28.

It is emphasized that the employment of the foamed plastic in the system does not appreciably add to the volume or weight of an electronic package employing conventional cooling techniques. By virtue of the structural properties of the plastic, the chassis may be made of much lighter gauge stock than is necessary in conventional packaging with the consequence that the overall assembly may be lighter in weight than the conventional assembly. From the standpoint of volume, the space around the tubes in conventional packages is normally open, to permit cooling by natural convection, but nonetheless contributes to the overall volume of the package; thus, the placement of the foamed plastic around the tubes in the present system does not contribute to the overall volume of the package.

While particular embodiments of the invention have been shown, it is to be understood that applicants do not wish to be limited thereto since many modifications can now be made by ones skilled in the art, and applicants, therefore, contemplate by the appended claims to cover all such modifications as fall within the true spirit and scope of their invention.

What is claimed is:

1. An electronic assembly comprising, a flat circuit board formed of insulating material provided with a plurality of tabs distributed along one edge thereof, electronic circuit components mechanically secured to both sides of said board, a like plurality of cylindrical plugs formed of insulating material each formed with a diametral slot for receiving a tab and having a plurality of grooves distributed about its periphery, a like plurality of baseless electron tubes lying in substantially the plane of said board each having its leads arranged in the grooves of a respective one of said plugs and extending along the sides of said board and mechanically secured to said circuit components, and a retaining ring formed of insulating material surrounding each of said plugs and its respective tab for maintaining said leads in said grooves and securing said plugs to said tabs, said grooves having a cross-sectional area sufficiently larger than the tube leads to permit the flow of air therethrough to cool said leads.

2. An electronic assembly comprising, a flat circuit board of generally rectangular shape provided with a plurality of tabs extending beyond and distributed along an edge of said board, said board being formed of insulating material, electronic circuit components secured to both sides of said board, a like plurality of cylindrical plugs each formed of insulating material and having a diametral slot of a width substantially equal to the thickness of said board for receiving a tab and provided with a plurality of grooves distributed about those portions of the periphery not occupied by said slot, a like plurality of baseless electron tubes positioned substantially in the plane of said board and extending from said one edge each having its leads individually arranged in the grooves of a respective one of said plugs and extending along the sides of said board and mechanically connected to said circuit components, and a retaining ring formed of insulating material surrounding each of said plugs and its respective tab for maintaining the tube leads in said grooves and securing said plugs to said tabs, said grooves being of larger cross-sectional area than said leads to provide a passage for air around said leads.

3. An electronic assembly comprising, a thin flat board formed of insulating material provided with at least one rectangularly shaped tab extending beyond an edge thereof, electronic circuit components mechanically secured to both sides of said board, a cylindrical plug formed of insulating material formed with a diametral slot of a width substantially equal to the thickness of said board and a depth substantially equal to the length of said tab for receiving said tab, said plug further having a plurality of longitudinal grooves distributed about the portion of its periphery not occupied by the slot, an elongated discharge device having uninsulated wire leads emerging from one end thereof, said one end of said discharge device being adjacent the extremity of said tab with said leads individually arranged in the grooves in said plug and extending along both sides of said board and secured to said circuit components, the electron discharge device thus lying in the plane of said board, and a retaining ring formed of insulating material surrounding said plug and tab for maintaining said leads in their respective grooves and mechanically securing the plug to said tab, said grooves having a cross-sectional area sufficiently larger than said leads to permit the flow of air therethrough to cool said leads.

4. An electronic assembly comprising, a flat circuit board formed of insulating material and provided with at least one tab along one edge thereof, electronic circuit components secured to at least one side of said board, a cylindrical plug formed of insulating material with a diametral slot for receiving a tab and having a plurality of longitudinal grooves distributed about its periphery, at least one baseless electron tube lying in substantially the plane of said board with its leads arranged one in each of the grooves of said plug and extending along the sides of said board and mechanically secured thereto, and a retaining ring formed of insulating material surrounding said plug and its respective tab for maintaining said leads in said grooves and securing said plug to said tab.

References Cited in the file of this patent

UNITED STATES PATENTS

| | | |
|---|---|---|
| 2,353,348 | McLaughlin | July 11, 1944 |
| 2,764,713 | Alden | Sept. 25, 1956 |
| 2,825,009 | McCoy | Feb. 25, 1958 |
| 2,836,772 | Wintrode et al. | May 27, 1958 |